United States Patent
Choi

(10) Patent No.: US 9,361,949 B2
(45) Date of Patent: Jun. 7, 2016

(54) SEMICONDUCTOR MEMORY DEVICE

(71) Applicant: SK hynix Inc., Icheon-si Gyeonggi-do (KR)

(72) Inventor: Eun Seok Choi, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 98 days.

(21) Appl. No.: 14/139,998

(22) Filed: Dec. 24, 2013

(65) Prior Publication Data

US 2015/0049534 A1    Feb. 19, 2015

(30) Foreign Application Priority Data

Aug. 16, 2013   (KR) .................... 10-2013-0097143

(51) Int. Cl.
    *G11C 11/413*    (2006.01)
    *G11C 5/06*      (2006.01)
    *G11C 5/02*      (2006.01)

(52) U.S. Cl.
    CPC ............... *G11C 5/063* (2013.01); *G11C 5/025* (2013.01)

(58) Field of Classification Search
    CPC ..................................................... G11C 11/413
    USPC .................................................... 365/185.05
    See application file for complete search history.

(56) References Cited

U.S. PATENT DOCUMENTS

| | | | |
|---|---|---|---|
| 2010/0097858 A1* | 4/2010 | Tokiwa et al. | 365/185.05 |
| 2011/0092038 A1* | 4/2011 | Choi et al. | 438/268 |
| 2012/0168858 A1* | 7/2012 | Hong | 257/330 |
| 2013/0175490 A1* | 7/2013 | Kusai et al. | 257/1 |
| 2013/0181184 A1* | 7/2013 | Sakuma et al. | 257/5 |
| 2014/0106569 A1* | 4/2014 | Oh et al. | 438/703 |

FOREIGN PATENT DOCUMENTS

| KR | 100272162 B1 | 8/2000 |
|---|---|---|
| KR | 1020110054361 A | 5/2011 |
| KR | 1020140026139 A | 3/2014 |

\* cited by examiner

*Primary Examiner* — Min Huang
(74) *Attorney, Agent, or Firm* — William Park & Associates Ltd.

(57) ABSTRACT

A semiconductor memory device includes a plurality of first stacked structures including a plurality of first material layers at ends of which first contact regions are defined, a plurality of second stacked structures including a plurality of second material layers, wherein second contact regions are defined at ends of the second material layers and arranged between the first stacked structures so that the first contact regions and the second contact regions overlap each other, and a plurality of lines coupled in common to the first contact regions and the second contact regions.

20 Claims, 15 Drawing Sheets

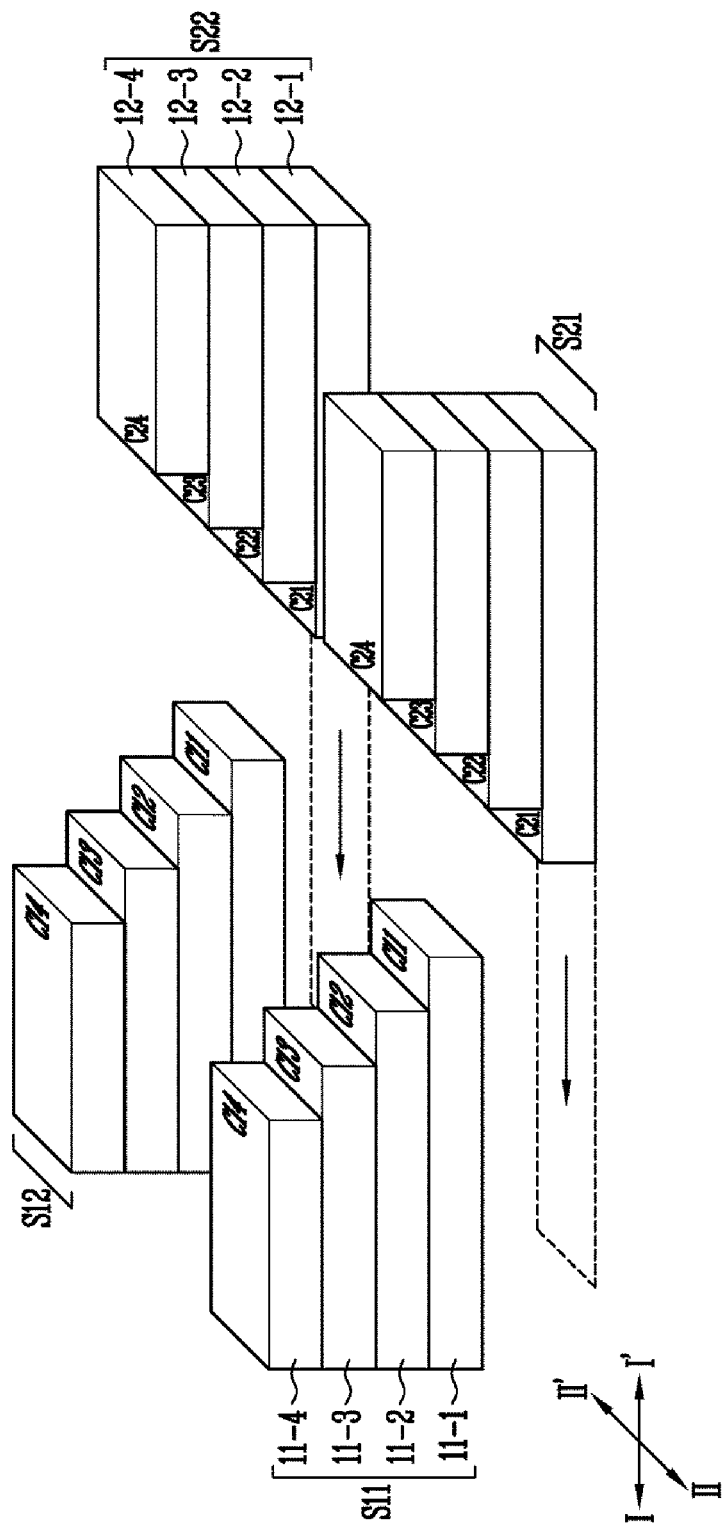

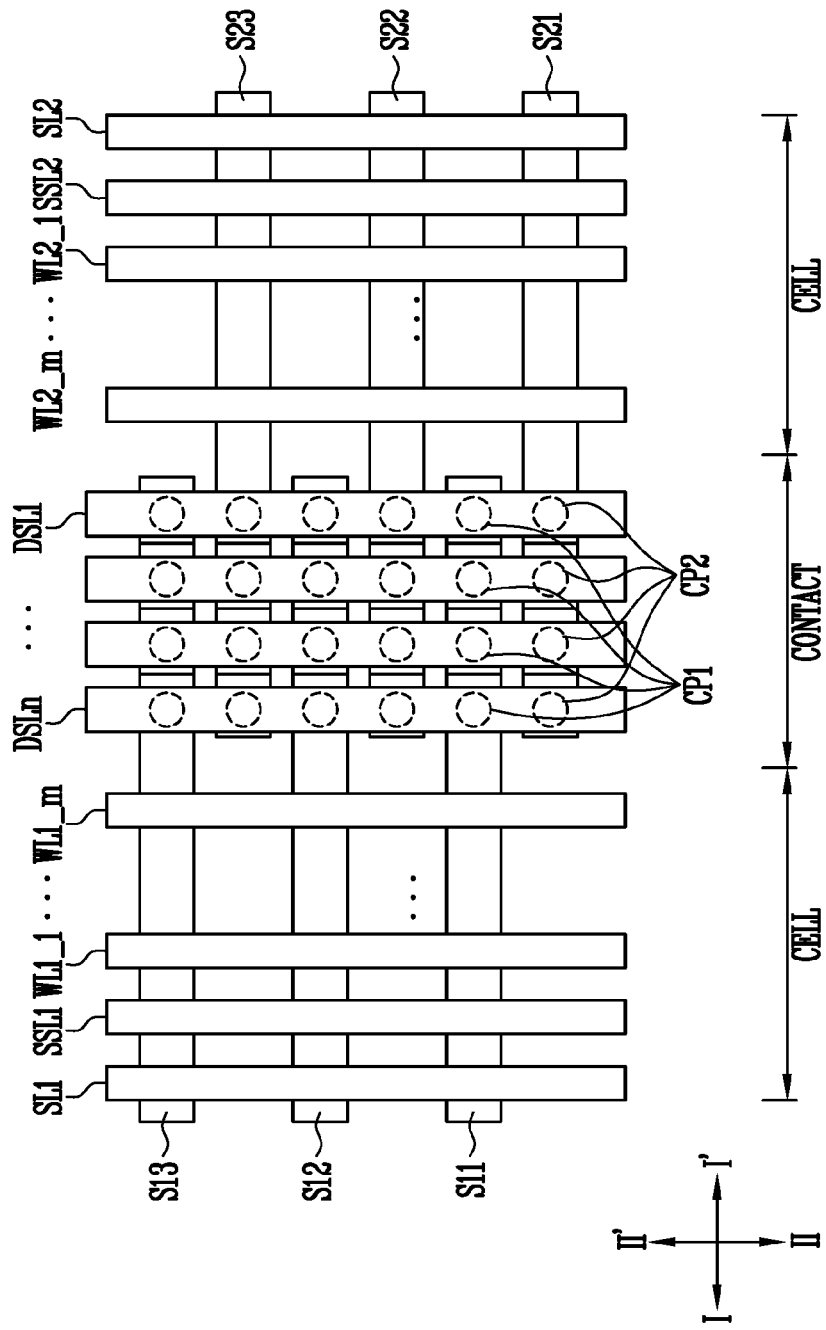

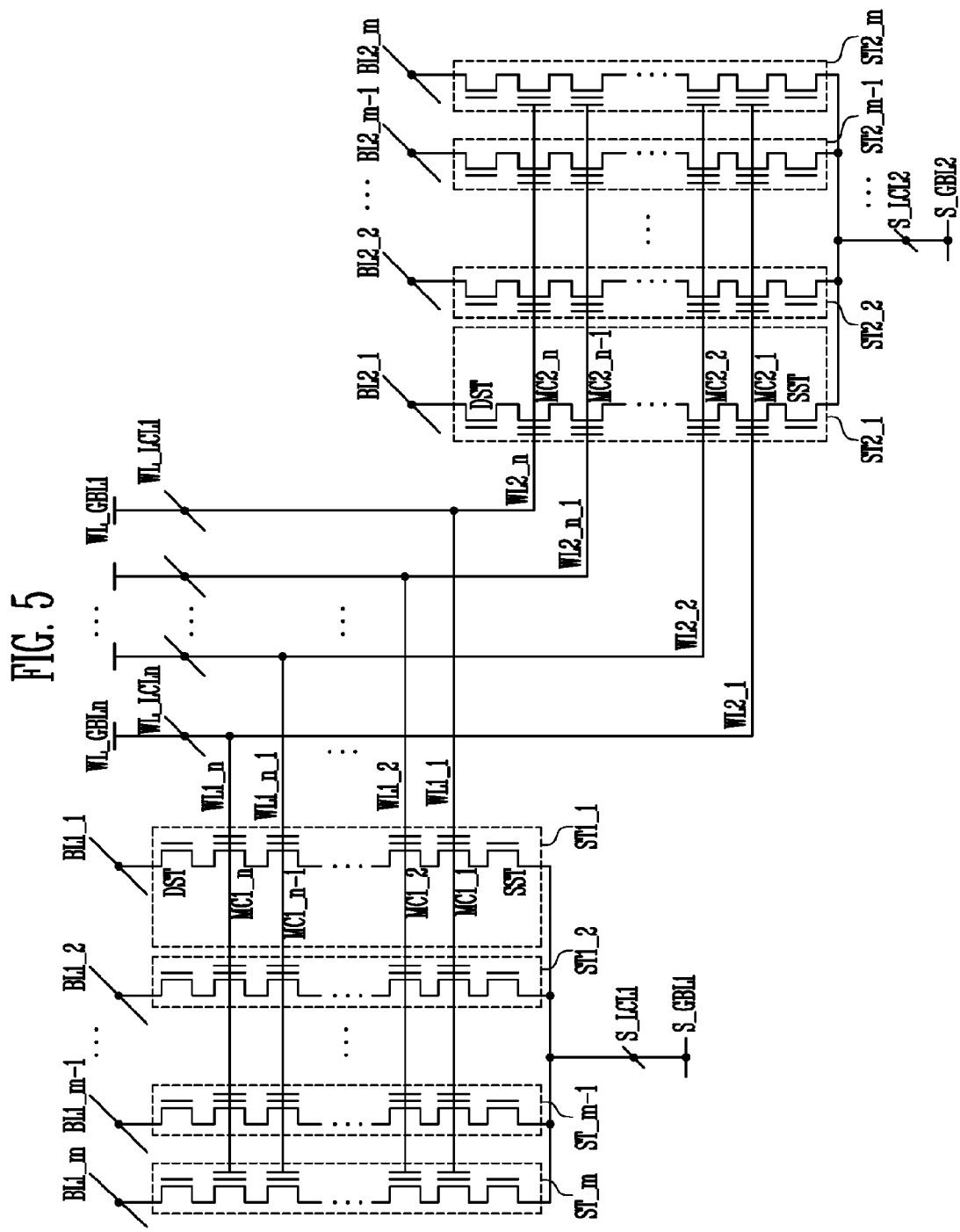

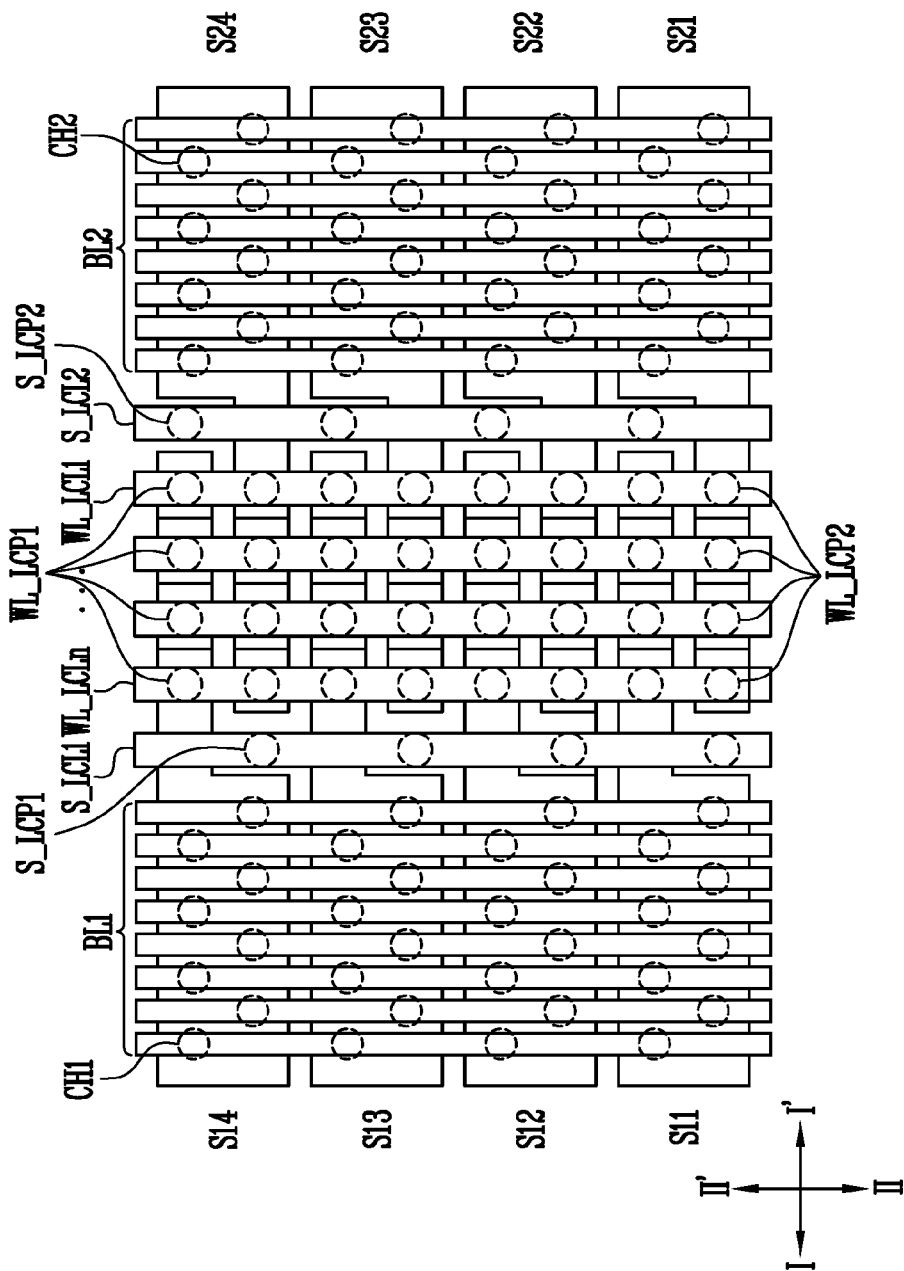

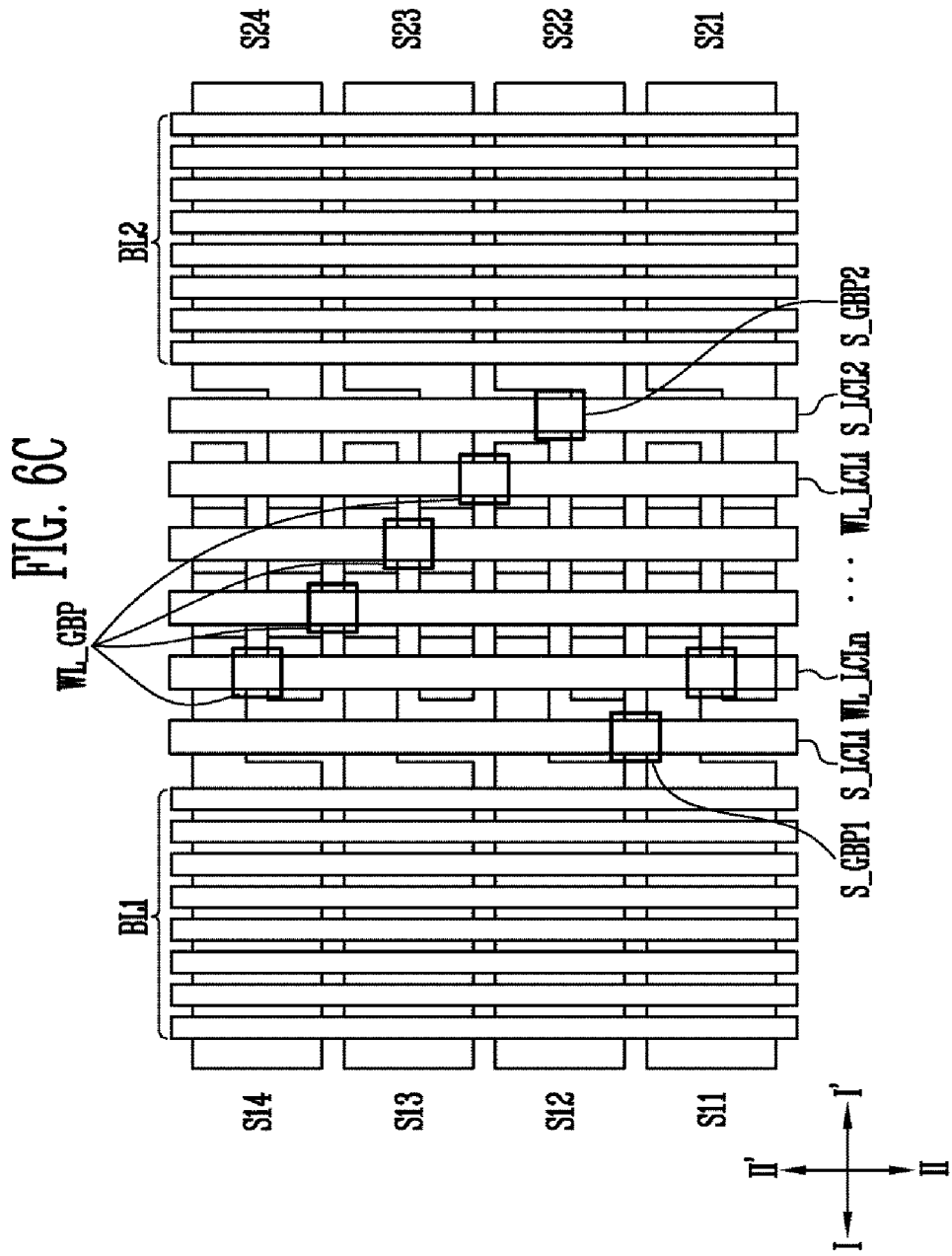

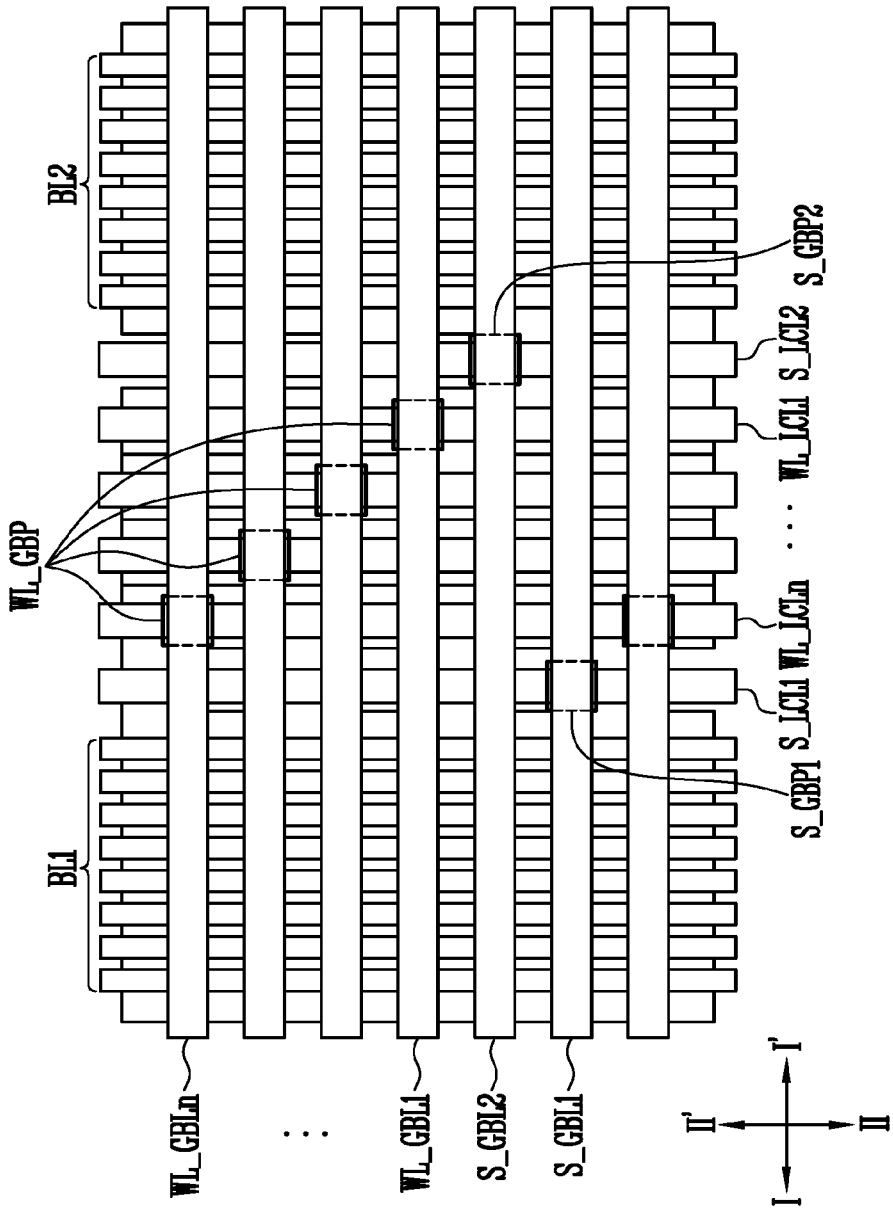

SEMICONDUCTOR MEMORY DEVICE

CROSS-REFERENCE TO RELATED APPLICATION

The present application claims priority to Korean patent application number 10-2013-0097143 filed on Aug. 16, 2013, in the Korean Intellectual Property Office, the entire disclosure of which is incorporated by reference herein.

BACKGROUND

1. Technical Field

Various embodiments relate generally to an electronic device and a method of operating the same and, more particularly, to a semiconductor memory device including three-dimensionally stacked memory cells.

2. Related Art

A non-volatile memory device preserves the stored data even when the power is cut off. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

A three-dimensional non-volatile memory device includes a plurality of stacked structures in which memory cells are stacked. In addition, each of the stepped structures includes a stepped contact region in order to control the memory cells in each layer. However, since the contact region has a large area, an increase in degree of integration of the memory device is limited.

SUMMARY

Various embodiments relate to a semiconductor memory device having an improved degree of integration.

A semiconductor memory device according to an embodiment of the present invention may include a plurality of first stacked structures including a plurality of first material layers at ends of which first contact regions are defined, a plurality of second stacked structures including a plurality of second material layers, wherein second contact regions are defined at ends of the second material layers and arranged between the first stacked structures so that the first contact regions and the second contact regions overlap each other, and a plurality of lines coupled in common to the first contact regions and the second contact regions.

A semiconductor memory device according to an embodiment of the present invention may include a plurality of first strings stacked sequentially; a plurality of second strings stacked sequentially; and a plurality of drain selection lines coupled in common to a first string, among the plurality of first strings, and a second string, among the plurality of second strings, wherein the plurality of drain selection lines are coupled in sequential order to the plurality of first strings and in reverse order to the plurality of second strings.

A semiconductor memory device according to an embodiment of the present invention may include a plurality of first strings including a plurality of first memory cells stacked sequentially; a plurality of second strings including a plurality of second memory cells stacked sequentially; a plurality of first word lines coupled to the plurality of first memory cells included in the plurality of first strings; a plurality of second word lines coupled to the plurality of second memory cells included in the plurality of second strings; and a plurality of local voltage supply lines coupled in common to a first word line, among the plurality of first word lines, and a second word line, among the plurality of second word lines, wherein the plurality of local voltage supply lines are coupled in sequential order to the plurality of first word lines and in reverse order to the plurality of second word lines.

BRIEF DESCRIPTION OF THE DRAWINGS

FIGS. 1A and 1B are perspective views of the structure of a semiconductor memory device according to an embodiment of the present invention.

FIGS. 3A and 3B are layout views of the structure of the semiconductor memory device described with reference to FIG. 2;

FIG. 5 is a circuit diagram of a cell array of a semiconductor memory device according to an embodiment of the present invention;

FIGS. 6A to 6D are layout views of the structure of the semiconductor memory device described with reference to FIGS. 4 and 5;

DETAILED DESCRIPTION

Figure 1B:
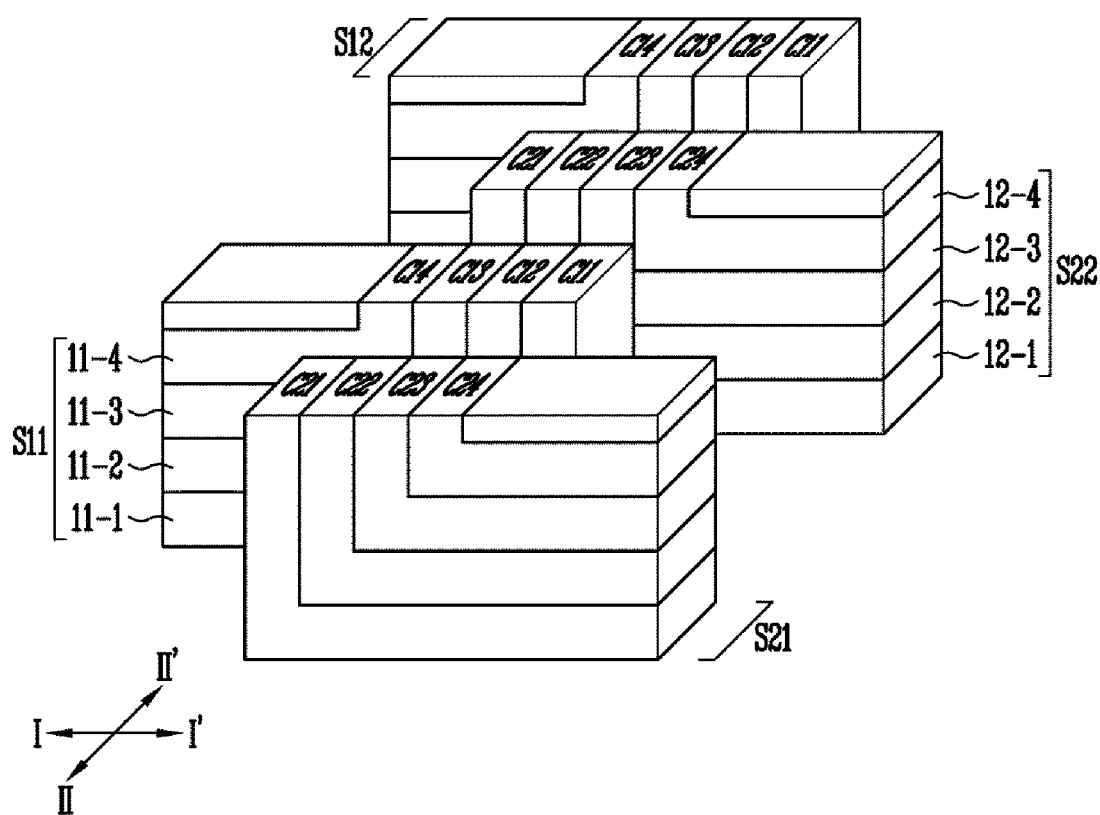

Hereinafter, various embodiments of the present invention will be described with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

Figure 1C:
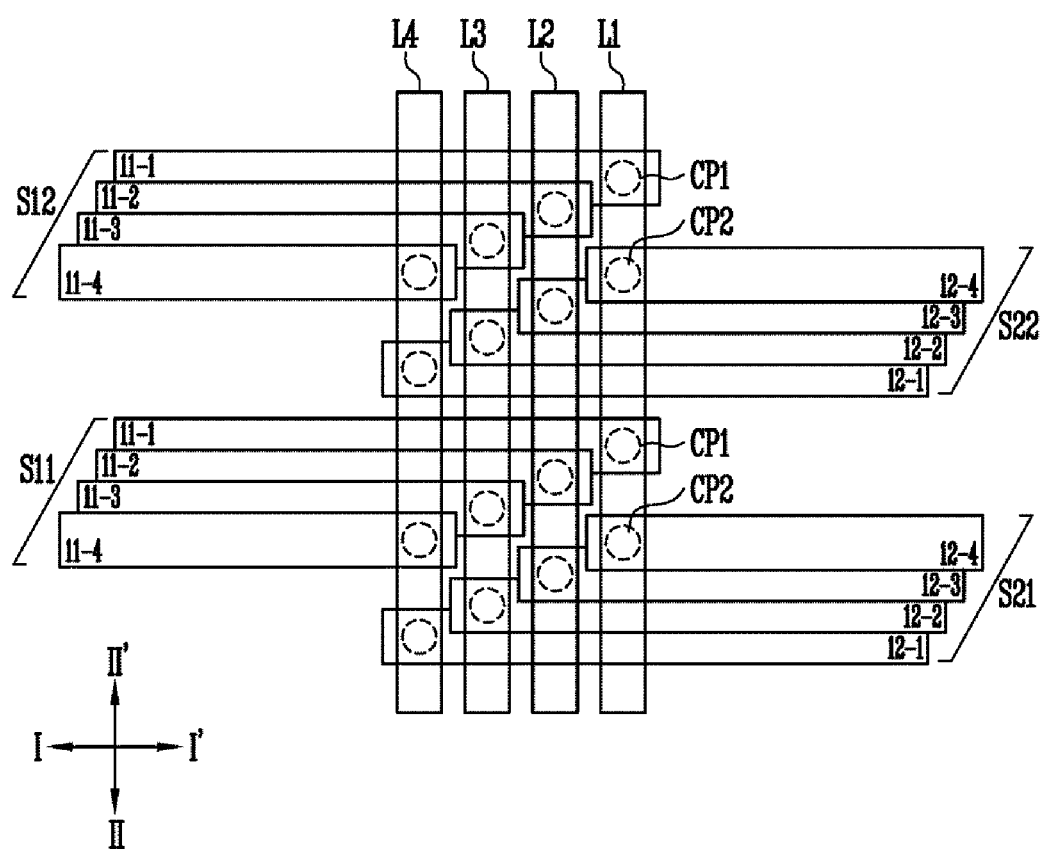
FIG. 1C is a layout view of FIGS. 1A and 1B.

FIGS. 1A and 1B are perspective views of the structure of a semiconductor memory device according to an embodiment of the present invention. FIG. 1C is a layout view of FIGS. 1A and 1B. To facilitate understanding of the present invention, FIGS. 1A and 1B mainly illustrate a contact region, and FIG. 1C illustrates laid out layers included in a single stacked structure by laying out layers included in the single stacked structure.

As illustrated in FIGS. 1A and 1B, a semiconductor memory device according to an embodiment of the present invention may include first stacked structures S11 and S12 and second stacked structures S21 and S22.

Each of the first stacked structures S11 and S12 may extend in a first direction I-I' and include 11-1-*th* to 11-*n*-*th* material layers, for example, 11-1 to 11-4 as shown. Each of the second stacked structures S21 and S22 may extend in the first direction I-I' and include 12-1-*th* to 12-*n*-*th* material layers, for example, 12-1 to 12-4 as shown. In the first stacked structures S11 and S12, C11*th* to C1*nth* contact regions, for example, C11 to C14 may be defined in first material layers 11-1 to 11-4, respectively. In the second stacked structures S21 and S22, C21*th* to C2*nth* contact regions, for example, C21 to C24 may be defined in second material layers 12-1 to 12-4, respectively. Here, n is a natural number equal to or greater than 2. With reference to FIGS. 1A to 1C, a description is made in reference to an embodiment in which n=4 is satisfied. However, although not specifically illustrated, any number of material layers, stacked structures and contact regions may be implemented without departing from the concepts discussed herein.

FIG. 1A illustrates ends of the stacked structures S11, S12, S21 and S22 are stepped to define the contact regions C11 to C14 and C21 to C24. FIG. 1B illustrates ends of the material layers 11-1 to 11-4 and 12-1 to 12-4 of the stacked structures S11, S12, S21 and S22 are bent upward to define the contact regions C11 to C14 and C21 to C24.

The first stacked structures S11 and S12 and the second stacked structures S21 and S22 may be arranged alternately with each other. To facilitate understanding of the present invention, FIG. 1A illustrates the first stacked structures S11 and S12 and the second stacked structures S21 and S22 are separated from each other. However, the first contact regions C11 to C14 of the first stacked structures S11 and S12 and the second contact regions C21 to C24 of the second stacked structures S21 and S22 may overlap each other in the second direction (i.e., II to II'). In other words, the second stacked structures S21 and S22 may be moved in the direction of the arrow and located between the first stacked structures S11 and S12 (refer to dotted line of FIG. 1A) to cause overlapping of the first stacked structures S11 and S12 with the second stacked structures S21 and S22 in the second direction (i.e., II to II'). The overlapping between stacked structures may be partial or complete. As such, the first contact regions (i.e., C11-C14) and the second contact regions (i.e., C21-C24) may overlap with each other in the second direction (i.e., II to II').

As illustrated in FIG. 1C, the semiconductor memory device may further include lines L1 to L4. The lines L1 to L4 may extend in a second direction II-II' crossing the first direction I-I' as illustrated in FIG. 1C. In addition, the lines L1 to L4 may be coupled in common to the first contact regions C11 to C14 and the second contact regions C21 to C24. For example, the lines L1 to L4 may be coupled to the first contact regions C11 to C14 through first contact plugs CP1 and to the second contact regions C21 to C24 through second contact plugs CP2.

The 11-1-*th* to 11-*n*-*th* material layers, for example, 11-1 to 11-4 may be coupled in sequential order to the lines L1 to L4, and the 12-1-*th* to 12-*n*-*th* material layers, for example, 12-1 to 12-4 may be coupled in reverse order to the lines L1 to L4. For example, the 11-1-*th* material layer 11-1 and the 12-4-*th* material layer 12-4 may be coupled to the same line L1, the 11-2-*th* material layer 11-2 and the 12-3-*th* material layer 12-3 may be coupled to the same line L2, the 11-3-*th* material layer 11-3 and the 12-2-*th* material layer 12-2 may be coupled to the same line L3, and the 11-4-*th* material layer 11-4 and the 12-1-*th* material layer 12-1 may be coupled to the same line L4.

FIGS. 1A and 1B illustrate each of the first and second material layers 11-1 to 11-4 and 12-1 to 12-4 having a single-layer structure. However, each of the first and second material layers may have a multilayered structure. For example, each of the first and second material layers may include at least one channel layer and at least one insulating layer that are stacked alternately with each other. In this example, the lines L1 to L4 may be drain selection lines. In another example, each of the first and second material layers may include at least one conductive layer and at least one insulating layer that are stacked alternately with each other. In this example, the lines L1 to L4 may be local voltage supply lines configured as word lines.

According to the above-described structures, since the first stacked structures S11 and S12 and the second stacked structures S21 and S22 overlap each other (i.e., in the second direction II'), the total area of the contact regions may be reduced.

Figure 2:
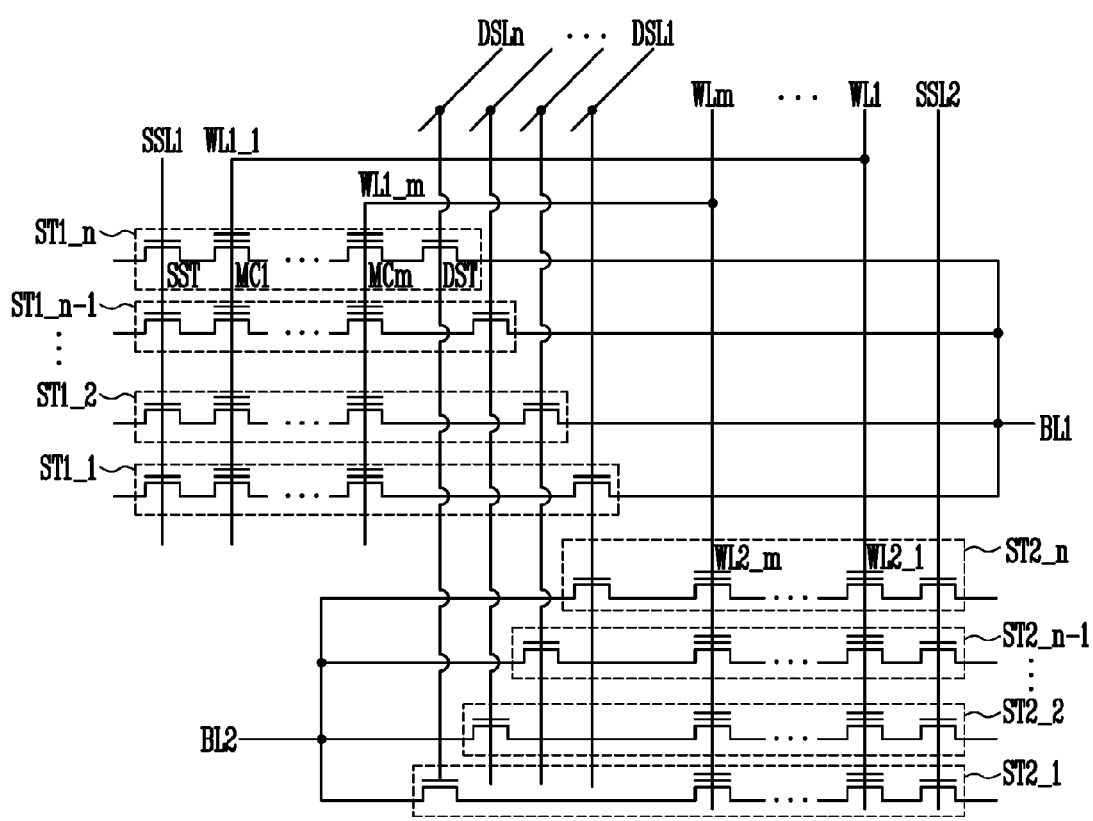
FIG. 2 is a circuit diagram of a cell array of a semiconductor memory device according to an embodiment of the present invention.

FIG. 2 is a circuit diagram of a cell array of a semiconductor memory device according to an embodiment of the present invention.

As illustrated in FIG. 2, a semiconductor memory device according to an embodiment of the present invention may include first strings ST1_1 to ST1_*n* (i.e., a plurality of first strings) and second strings ST2_1 to ST2_*n* (i.e., a plurality of second strings) that are arranged in a horizontal direction to a substrate. The first strings ST1_1 to ST1_*n* may be sequentially stacked, and the second strings ST2_1 to ST2_*n* may be sequentially stacked, where n is a natural number equal to or greater than 2. The sequentially stacked first strings ST1_1 to ST1_*n* may be included in a single first stacked structure, and the sequentially stacked second strings ST2_1 to ST2_*n* may be included in a second stacked structure. In addition, each of the strings ST1_1 to ST1_*n* and ST2_1 to ST2_*n* may include at least one source selection transistor SST, first to m-th memory cells MC1 to MCm, where m is a natural number equal to or greater than 2, and at least one drain selection transistor DST.

The semiconductor memory device may further include first to n-th drain selection lines DSL1 to DSLn, each of which may be coupled in common to one of the first strings ST1_1 to ST1_*n* and one of the second strings ST2_1 to ST2_*n*. The first to n-th drain selection lines DSL1 to DSLn may be coupled in sequential order to the first strings ST1_1 to ST1_*n* and in reverse order to the second strings ST2_1 to ST2_*n*. For example, the first string ST1_1 and the second string ST2_*n* may be coupled in common to the first drain selection line DSL1, and the first string ST1_*n* and the second string ST2_1 may be coupled in common to the n-th drain selection line DSLn.

The semiconductor memory device may further include first to m-th word lines WL1 to WLm, where m is a natural number equal to or greater than 2. The first to m-th memory cells MC1 to MCm of the first strings ST1_1 to ST1_*n* may be coupled to first word lines WL1_1 to WL1_*m* (i.e., a plurality of first word lines). The first to m-th memory cells MC1 to MCm of the second strings ST2_1 to ST2_*m* may be coupled to second word lines WL2_1 to WL2_*m* (i.e., a plurality of second word lines). The first word lines WL1_1 to WL1_*m* and the second word lines WL2_1 to WL2_*m* may be coupled to each other. For example, the first word line WL1_1 and the second word line WL2-1 may be coupled by the first word line WL1 and controlled in response to the same signal. The first word line WL1_*m* and the second word line WL2_*m* may be coupled by the m-th word line WLm and controlled in response to the same signal.

The semiconductor memory device may further include first and second source selection lines SSL1 and SSL2. The source selection transistors SST of the first strings ST1_1 to ST1_*n* may be coupled to the first source selection line SSL1, and the source selection transistors SST of the second strings ST2_1 to ST2_*n* may be coupled to the second source selection line SSL2.

In addition, the semiconductor memory device may further include first and second bit lines BL1 and BL2. The drain selection transistors DST of the first strings ST1_1 to ST1_n may be coupled to the first bit line BL1. The drain selection transistors DST of the second strings ST2_1 to ST2_n may be coupled to the second bit line BL2.

According to the above-described circuit structure, in the strings ST1_1 to ST1_n and ST2_1 to ST2_n which are coupled to the same drain selection line, among the first to n-th drain selection lines DSL1 to DSLn, first memory cells, coupled to the kth first word line WL1_k, and second memory cells, coupled to the kth second word line WL2_K, may be driven as a single page, where k is a natural number that satisfies 1≤k≤m.

Figure 3B:
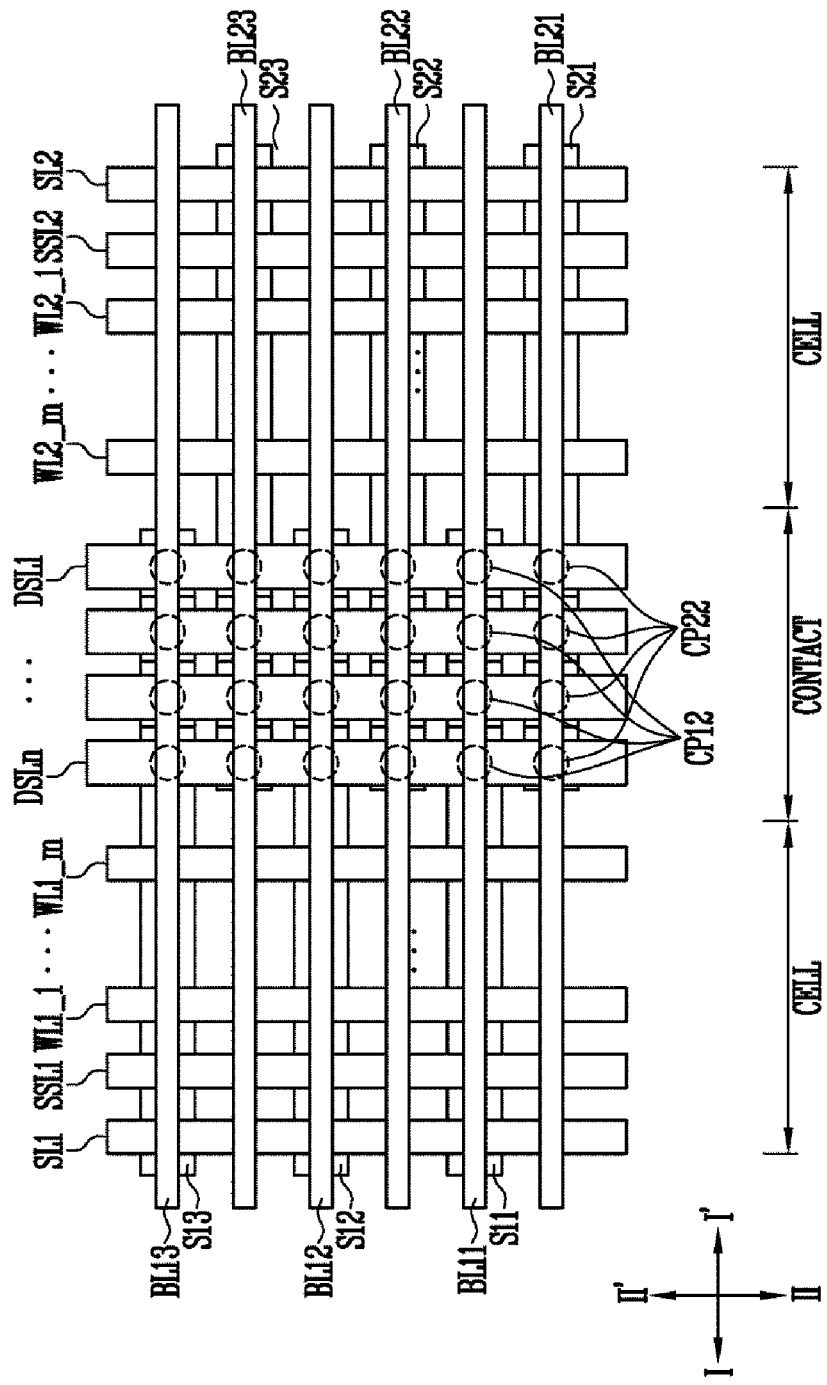

FIGS. 3A and 3b are layout views of the structure of the semiconductor memory device described with reference to FIG. 2.

FIG. 3A is a layout view showing positions of stacked structures, source lines, source selection lines, word lines, drain selection lines and contact plugs. As illustrated in FIG. 3A, first stacked structures S11 to S13 and second stacked structures S21 to S23 may extend in the first direction I-I' and be arranged alternately with each other in the second direction II-II'.

Each of the stacked structures S11 to S13 and S21 to S23 may include the cell region CELL and the contact region CONTACT. The first stacked structures S11 to S13 may include first contact regions, and the second stacked structures S21 to S23 may include second contact regions. In the stacked structures S11 to S13 and S21 to S23, first contact plugs CP1 may be located in the first contact regions, respectively, and second contact plugs CP2 may be located in the second contact regions, respectively. The first to n-th drain selection lines DSL1 to DSLn may extend in the second direction II-II' and be located in the contact region CONTACT. Each of the first to n-th drain selection lines DSL1 to DSLn may be coupled in common to the first and second contact regions. The first to n-th drain selection lines DSL1 to DSLn may be coupled to the first contact regions through the first contact plugs CP1 and to the second contact regions through the second contact plugs CP2.

The first to m-th first word lines WL1_1 to WL1_m and the first to m-th second word lines WL2_1 to WL2_m may be located in the cell region CELL, where m is a natural number equal to or greater than 2. The first to m-th first word lines WL1_1 to WL1_m may contact the first stacked structures S11 to S13 and extend in the second direction II-II'. The first to m-th second word lines WL2_1 to WL2_m may contact the second stacked structures S21 to S23 and extend in the second direction II-II'.

The first source line SL1 and at least one first source selection line SSL1 may be located in the cell region CELL. The first source line SL1 and at least one first source selection line SSL1 may be located at one side of the first to m-th first word lines WL1_1 to WL1_m, contact the first stacked structures S11 to S13 and extend in the second direction II-II'.

The second source line SL2 and at least one second source selection line SSL2 may be located in the cell region CELL. The second source line SL2 and at least one second source selection line SSL2 may be located at one side of the first to m-th second word lines WL2_1 to WL2_m, contact the second stacked structures S21 to S23 and extend in the second direction II-II'.

FIG. 3B is a layout view showing positions of bit lines and contact plugs. As illustrated in FIG. 3B, contact plugs CP12 may be located in the first contact regions and coupled to the first to n-th drain selection lines DSL1 to DSLn, respectively.

In addition, contact plugs CP22 may be located in the second contact regions and coupled to the first to n-th drain selection lines DSL1 to DSLn, respectively.

In FIG. 3B, first bit lines BL11 to BL13 may extend in the first direction I-I' and be coupled to drain selection transistors of first strings through the contact plugs CP12. The first bit lines BL11 to BL13 may be arranged in the first stacked structures S11 to S13, respectively.

In addition, second bit lines BL21 to BL23 may extend in the first direction I-I' and be coupled to the drain selection transistors of the respective strings through the contact plugs CP22. The second bit lines BL21 to BL23 may be coupled to the second stacked structures S21 to S23, respectively.

According to the above-described structure, since all the first and second contact regions are located in the single contact region CONTACT, the total area of the contact region CONTACT may be reduced. Therefore, a degree of integration of the semiconductor memory device may be improved.

Figure 4:
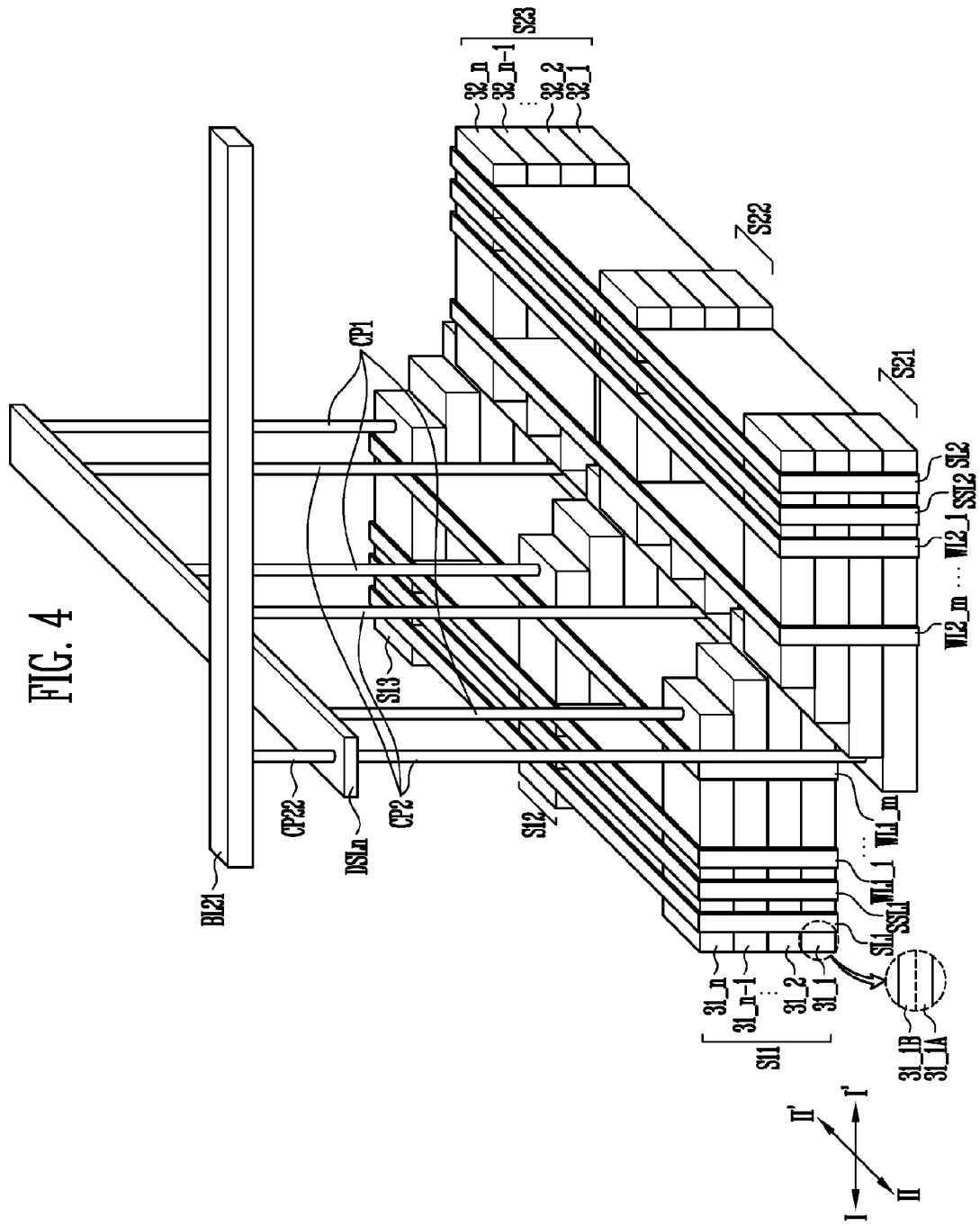
FIG. 4 is a perspective view of the structure of the semiconductor memory device described with reference to FIG. 2.

FIG. 4 is a perspective view of the structure of the semiconductor memory device described with reference to FIG. 2.

As illustrated in FIG. 4, each of the first stacked structures S11 to S13 may include first layers 31_1 to 31_n, and the second stacked structures S21 to S23 may include second layers 32_1 to 32_n. Each of the first layers 31_1 to 31_n may include least one channel layer 31_1A and at least one insulating layer 31_1B that are stacked alternately with each other. The second layers 32_1 to 32_n may have substantially the same configuration as the first layers 31_1 to 31_n.

First memory layers (not illustrated) may be interposed between the first stacked structures S11 to S13 and the first word lines WL1_1 to WL1_m. Second memory layers (not illustrated) may be interposed between the second stacked structures S21 to S23 and the second word lines WL2_1 to WL2_m. The first and second memory layers may include a tunnel insulating layer, a data storage layer and a charge blocking layer. For example, the data storage layer may include at least one of a floating gate including polysilicon, a charge trap layer including a nitride, nanodots or a phase-change material layer.

The semiconductor memory device may be configured such that the drain selection lines DSL1 to DSLn may be formed over the first and second stacked structures S11 to S13, S21 to S23 and the bit lines BL11 to BL13 and BL21 to BL23 may be arranged over the drain selection lines DSL1 to DSLn.

To facilitate understanding of the present invention, FIG. 4 illustrates only the first contact plugs CP1 and second contact plugs CP2 that are coupled to the n-th drain selection line DSLn. In addition, FIG. 4 illustrates only the second bit line BL21 and the contact plug CP22 coupled thereto.

According to the above-described structure, a degree of integration of the semiconductor memory device may be improved by efficiently arranging the drain selection lines DSL1 to DSLn, the bit lines BL11 to BL13 and BL21 to BL23 and the contact plugs CP1 to CP12 and CP2 to CP22 coupled thereto.

FIG. 5 is a circuit diagram of a cell array of a semiconductor memory device according to an embodiment of the present invention.

As illustrated in FIG. 5, the semiconductor memory device may include the first strings ST1_1 to ST1_m and the second strings ST2_1 to ST2_m that are arranged in a vertical direction to the substrate. Each of the first strings ST1_1 to ST1_m may include at least one source selection transistor SST, first memory cells MC1_1 to MC1_n (i.e., a plurality of first memory cells) and at least one drain selection transistor DST that are sequentially stacked. In addition, each of the second strings ST2_1 to ST2_m may include at least one source selection transistor SST, second memory cells MC2_1 to MC2_n (i.e., a plurality of second memory cells) and at least one drain selection transistor DST that are sequentially stacked, where n and m are natural numbers equal to or greater than 2.

The semiconductor memory device may include first to n-th first word lines WL1_1 to WL1_n (i.e., a plurality of first word lines) that are coupled to the first memory cells MC1_1 to MC1_n included in the first strings ST1_1 to ST1_m. In addition, the semiconductor memory device may include first to n-th second word lines WL2_1 to WL2_n (i.e., a plurality of second word lines) that are coupled to the second memory cells MC2_1 to MC2_n included in the second strings ST2_1 to ST2_m.

The semiconductor memory device may include first to n-th local voltage supply lines WL_LCL1 to WL_LCLn configured as word lines. Each of the first to n-th local voltage supply lines WL_LCL1 to WL_LCLn may be coupled in common to the first word lines WL1_1 to WL1_n and the second word lines WL2_1 to WL2_n.

The first to n-th local voltage supply lines WL_LCL1 to WL_LCLn may be coupled in sequential order to the first word lines WL1_1 to WL1_n and in reverse order to the second word lines WL2_1 to WL2_n. For example, the first word line WL1_1 and the second word line WL2_n may be coupled in common to the first local voltage supply line WL_LCL1, and the first word line WL1_n and the second word line WL2_1 may be coupled in common to the n-th local voltage supply line WL_LCLn.

The semiconductor memory device may further include first to n-th global voltage supply lines WL_GBL1 to WL_GBLn configured as word lines that are coupled to the first to n-th local voltage supply lines WL_LCL1 to WL_LCLn configured as word lines, respectively.

The semiconductor memory device may further include a first local voltage supply line S_LCL1, configured as a source, coupled in common to the first strings ST1_1 to ST1_m, a second local voltage supply line S_LCL2, configured as a source, coupled in common to the second strings ST2_1 to ST2_m, a first global voltage supply line S_GBL1, configured as a source, coupled to the first local voltage supply line S_LCL1, and a second global voltage supply line S_GBL2, configured as a source, coupled to the second local voltage supply line S_LCL2.

In addition, the semiconductor memory device may further include first bit lines BL1_1 to BL1_m coupled to the first strings ST1_1 to ST1_m, respectively, and second bit lines BL2_1 to BL2_m coupled to the second strings ST2_1 to ST2_m, respectively.

According to the above-described circuit structure, the first and second memory cells MC1_1 to MC1_n and MC2_1 to MC2_n, which are coupled to the same local voltage supply line, among the first to n-th local voltage supply lines WL_LCL1 to WL_LCLn configured as word lines, may be driven as a single page. For example, the first memory cells MC1_1 of the first strings ST1_1 to ST1_m and the second memory cells MC2_n of the second strings ST2_1 to ST2_m may be coupled in common to the first local voltage supply line WL_LCL1 and driven as a single page. In addition, the first memory cells MC1_n of the first strings ST1_1 to ST1_m and the second memory cells MC2_1 of the second strings ST2_1 to ST2_m may be coupled in common to the n-th local voltage supply line WL_LCLn and driven as a single page.

FIGS. 6A to 6D are layout views of the structure of the semiconductor memory device described with reference to FIGS. 4 and 5. For illustrative purposes, layouts are illustrated according to lines.

Figure 6A:
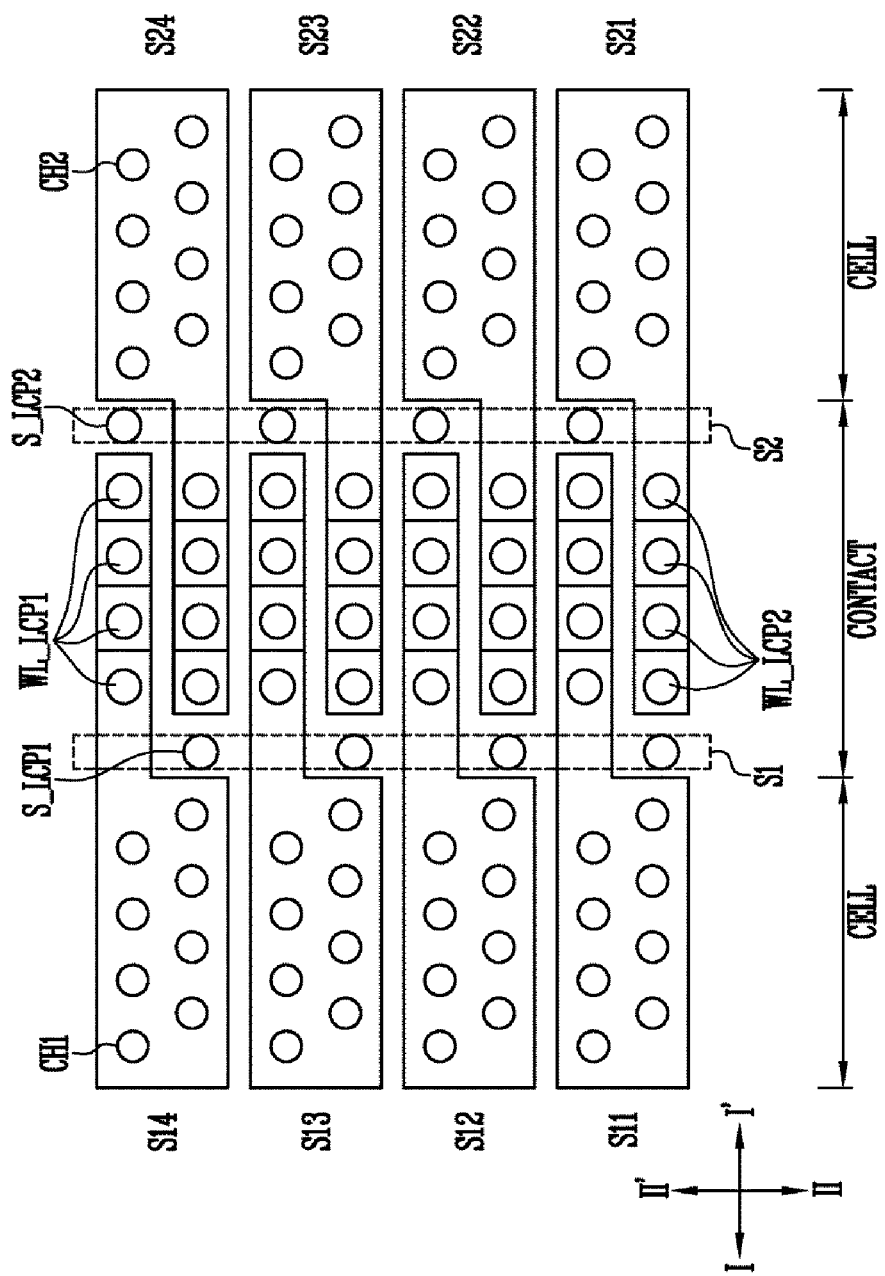

FIG. 6A is a layout view showing positions of stacked structures, channel layers and local contact plugs. As illustrated in FIG. 6A, first stacked structures S11 to S14 and second stacked structures S21 to S24 may extend in the first direction I-I' and be arranged alternately with each other in the second direction II-II'.

Each of the first and second stacked structures S11 to S14 and S21 to S24 may include the cell region CELL and the contact region CONTACT. First channel layers CH1 may be located in the cell region CELL of the first stacked structures S11 to S14, and second channel layers CH2 may be located in the cell region CELL of the second stacked structures S21 to S24. For example, the first and second channel layers CH1 and CH2 may be arranged in a matrix format or have centers offset from each other. The channel layers CH1 and CH2 arranged in the first direction I-I' may form a single channel row. At least one channel row may be located in each of the stacked structures S11 to S14 and S21 to S24. For example, at least two channel layers CH1 and CH2 that are adjacent to each other in the second direction II-II' may be coupled by a coupling pattern (not illustrated) and formed in a U shape or a W shape.

In addition, the cell region CELL may have the same or different widths from the contact region CONTACT. FIG. 6A illustrates the cell region CELL has a greater width than the contact region CONTACT (i.e., see S11 to S14 or S21 to S24).

First and second local contact plugs WL_LCP1 and WL_LCP2 configured as word lines may be located in the contact region CONTACT. The first local contact plugs WL_LCP1 may be located in first contact regions of the first stacked structures S11 to S14, respectively, and the word-line second local contact plugs WL_LCP2 may be located in second contact regions of the second stacked structures S21 to S24, respectively.

The first and second source regions S1 and S2 may be formed in a substrate (not illustrated) and located between the first stacked structures S11 to S14 and the second stacked structures S21 to S24. For example, the first source region S1 may be located between the cell region CELL of the first stacked structures S11 to S14 and the second contact regions of the second stacked structures S21 to S24 and have a linear shape extending in the second direction II-II'. The second source region S2 may be located between the cell region CELL of the second stacked structures S21 to S24 and the first contact regions of the first stacked structures S21 to S24 and have a linear shape extending in the second direction II-II'.

First local contact plugs S_LCP1 configured as sources may be coupled to the first source region S1, and second local contact plugs S_LCP2 configured as sources may be coupled to the second source region S2. The first local contact plugs S_LCP1 and the second local contact plugs S_LCP2 may be located between the first stacked structures S11 to S14 and the second stacked structures S21 to S24. For example, the first local contact plugs S_LCP1 may be located on the same level as the channel layers CH2 of the second stacked structures S21 to S24 or the second local contact plugs WL_LCP2 configured as word lines. The second local contact plugs S_LCP2 configured as sources may be located on the same level as the channel layers CH1 of the first stacked structures S11 to S14 or the first local contact plugs WL_LCP1 configured as word lines.

FIG. 6B is a layout view showing positions of local voltage supply lines and bit lines. As illustrated in FIG. 6B, the local voltage supply lines WL_LCL1 to WL_LCLn configured as word lines may be coupled to the first and second local contact plugs WL_LCP1 and WL_LCP2 and extend in the second direction II-II'. The first local voltage supply line S_LCL1 configured as a source may be coupled to the first local contact plugs S_LCP1 configured as sources and extend in the second direction II-II'. The second local voltage supply line S_LCL2 configured as a source may be coupled to the second local contact plugs S_LCP2 and extend in the second direction II-II'. In addition, the first bit lines BL1 may be coupled to the first channel layers CH1 and extend in the second direction II-II'. The second bit lines BL2 may be coupled to the second channel layers CH2 and extend in the second direction II-II'.

FIG. 6C is a layout view showing positions of global voltage supply lines and global contact plugs. As illustrated in FIG. 6C, at least one first global contact plug S_GBP1 configured as a source may be coupled to the first local voltage supply line S_LCL1 configured as a source, and at least one second global contact plug S_GBP2 configured as a source may be coupled to the second local voltage supply line S_LCL2 configured as a source. In addition, the global contact plugs WL_GBP configured as word lines may be coupled to the local voltage supply lines WL_LCL1 to WL_LCLn configured as word lines, respectively.

FIG. 6D is a layout view showing positions of global voltage supply lines. As illustrated in FIG. 6D, the global voltage supply lines WL_GBL1 to WL_GBLn configured as word lines may be coupled to the global contact plugs WL_GBP configured as word lines, respectively, and extend in the first direction I-I'. In addition, the first global voltage supply line S_GBL1 configured as a source may be coupled to the first global contact plug S_GBP1 configured as a source and extend in the first direction I-I'. The second global voltage supply line S_GBL2 configured as a source may be coupled to the second global contact plug S_GBP2 configured as a source and extend in the first direction I-I'.

Figure 7:
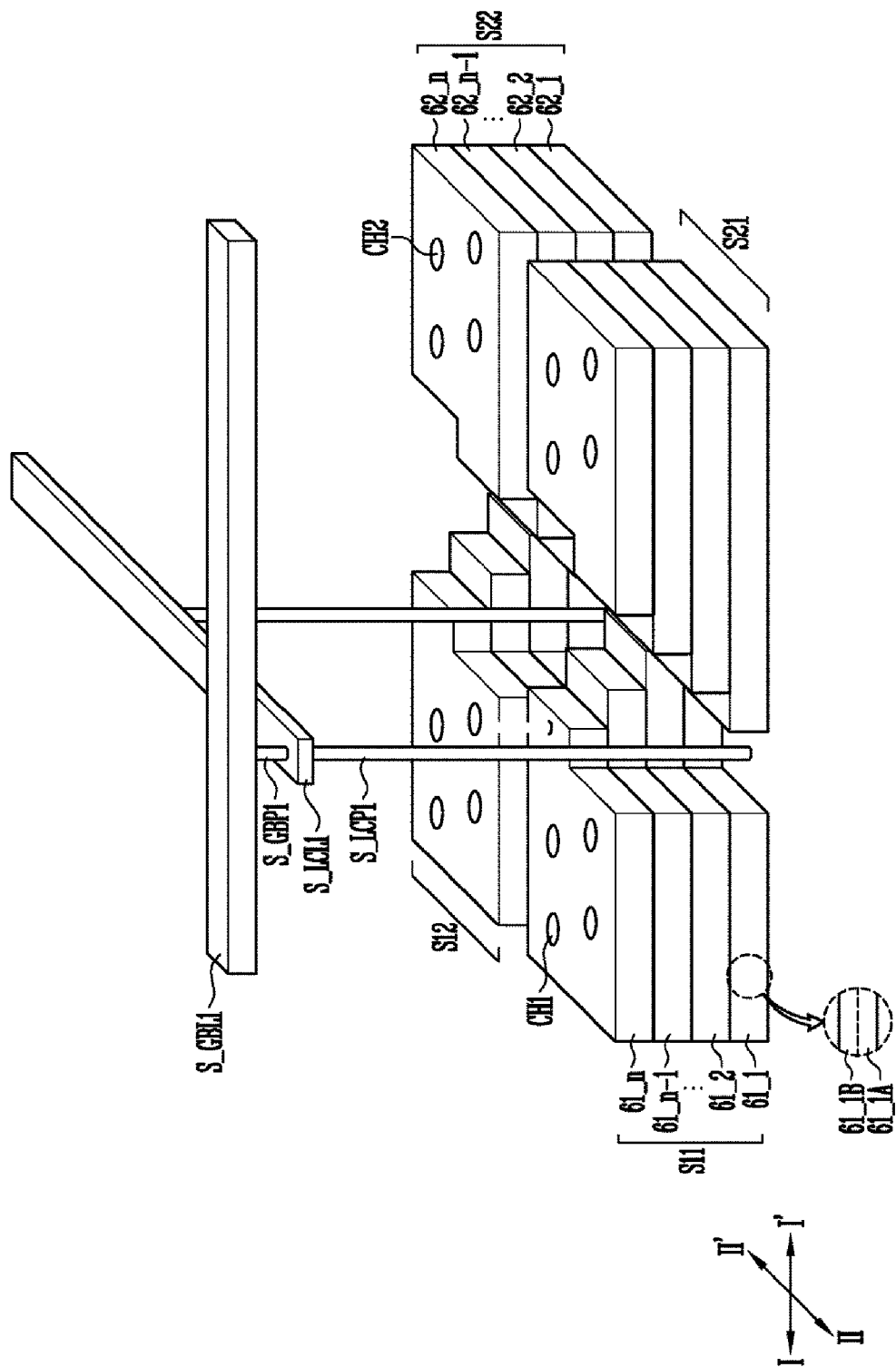
FIG. 7 is a perspective view of the structure of the semiconductor memory device described with reference to FIG. 5.

FIG. 7 is a perspective view of the structure of the semiconductor memory device described with reference to FIG. 5.

As illustrated in FIG. 7, each of the first stacked structures S11 and S12 may include first layers 61_1 to 61_n, and each of the second stacked structures S21 and S22 may include second layers 62_1 to 62_n. In addition, each of the first layers 61_1 to 61_n may include at least one conductive layer 61_1A and at least one insulating layer 61_1B that are stacked alternately with each other. The conductive layer 61_1A may be a word line. Examples of the conductive layer 61_1A may include polysilicon, amorphous silicon, titanium, a titanium nitride layer, tungsten, a tungsten nitride layer and so on. The second layers 62_1 to 62_n may substantially the same configurations as the first layers 61_1 to 61_n.

The first channel layers CH1 may pass through the first stacked structures S11 and S12, and the second channel layers CH2 may pass through the second stacked structures S21 and S22. In addition, first memory layers (not illustrated) may be interposed between the first channel layers CH1 and the first layers 61_1 to 61_n, and second memory layers (not illustrated) may be interposed between the second channel layers CH2 and the second layers 62_1 to 62_n. The first and second memory layers may include a tunnel insulating layer, a data storage layer and a charge blocking layer. For example, the data storage layer may include at least one of a floating gate including polysilicon, a charge trap layer including a nitride, nanodots or a phase-change material layer.

The semiconductor memory device may be configured such that local voltage lines may be arranged on stacked structures and global voltage lines may be arranged on the local voltage lines. For example, the first and second local voltage supply lines S_LCL1 and S_LCL2 configured as sources and the local voltage supply lines WL_LCL1 to WL_LCLn configured as word lines may be arranged on the first and second stacked structures S11, S12, S21 and S22, and the first and second global voltage supply lines S_GBL1 and S_GBL2 configured as sources and the global voltage supply lines WL_GBL1 to WL_GBLn configured as word lines may be arranged thereon.

In order to facilitate understanding of the present invention, FIG. 7 illustrates the first local voltage supply line S_LCL1 and the first local contact plug S_LCP1 coupled thereto. In addition, FIG. 7 illustrates the first global voltage supply line S_GBL1 and the first global contact plug S_GBP1 coupled thereto.

According to the above-described configuration, a word line voltage and a source voltage may be applied using a strapping structure. Therefore, even when word lines and source regions include materials having relatively large resistance, since local voltage supply lines and global voltage supply lines include materials having relatively small resistance, the word line voltage and the source line voltage may be applied at high speeds.

Figure 8:
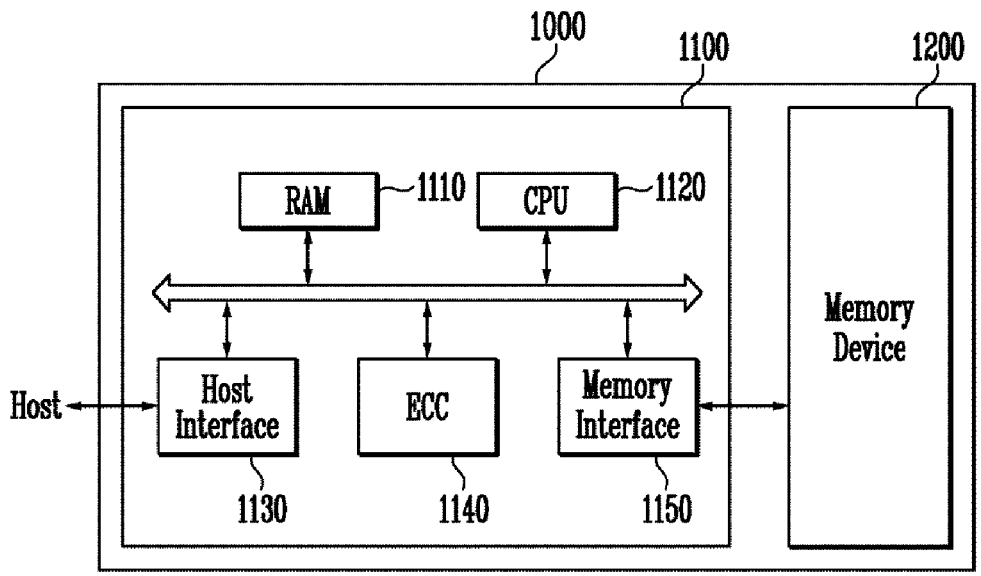
FIG. 8 is a block diagram of the configuration of a memory system according to an embodiment of the present invention.

FIG. 8 is a block diagram of the configuration of a memory system according to an embodiment of the present invention.

As illustrated in FIG. 8, a memory system 1000 according to an embodiment of the invention may include a memory device 1200 and a controller 1100.

The memory device 1200 may be used to store various data types such as text, graphic and software code. The memory device 1200 may be a non-volatile memory. The memory device 1200 may be the semiconductor memory device described above with reference to FIGS. 1A to 7. In addition, the memory device 1200 may include a plurality of first stacked structures, a plurality of second stacked structures and a plurality of lines. The first stacked structures may include first to n-th material layers that have a plurality of first contact regions defined at ends thereof (where n is a natural number equal to or greater than 2). The second stacked structures may include first to n-th material layers that have second contact regions defined at ends thereof and be disposed between the first stacked structures so that the first contact regions and the second contact regions may overlap each other. The lines may be coupled in common to the first contact regions and the second contact regions. Since the memory device 1200 is configured and manufactured in substantially the same manner as described above, a detailed description thereof will be omitted.

The controller 1100 may be coupled to a host and the memory device 1200 and configured to access the memory device 1200 in response to a request from the host. For example, the controller 1100 may be configured to control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1110, a cache memory between the memory device 1200 and the host, and a buffer memory between the memory device 1200 and the host. The RAM 1110 may be replaced by a static random access memory (SRAM) or a read only memory (ROM).

The CPU 1120 may be configured to control the general operation of the controller 1100. For example, the CPU 1120 may be configured to operate firmware such as a flash translation layer (FTL) stored in the RAM 1110.

The host interface 1130 may be configured to interface with the host. For example, the controller 1100 may communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may be configured to detect and correct errors included in data read from the memory device 1200 by using error correction codes (ECCs).

The memory interface 1150 may be configured to interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

As described above, since the memory system 1000 according to an embodiment of the present invention includes the memory device 1200 that has an improved degree of integration and an increased driving speed, data storage capacity and driving speed of the memory system 1000 may be increased.

Figure 9:
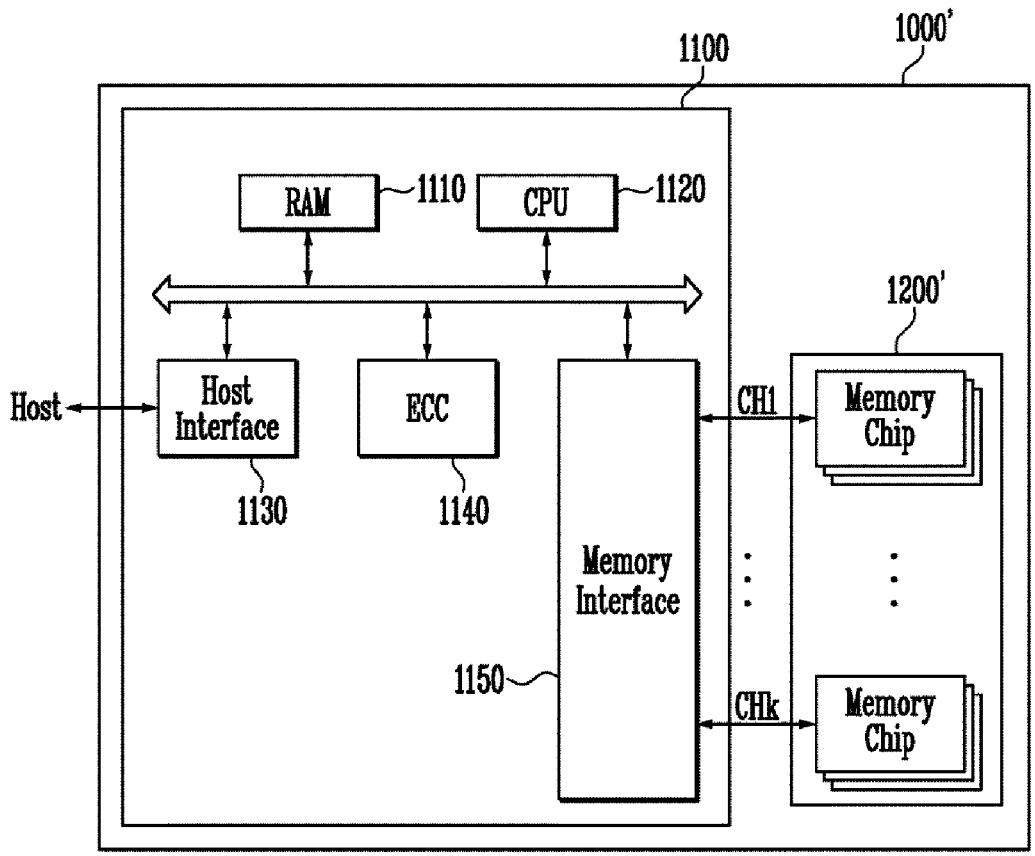
FIG. 9 is a block diagram of the configuration of a memory system according to an embodiment of the present invention.

FIG. 9 is a block diagram of the configuration of a memory system according to an embodiment of the present invention. Hereinafter, a description of common contents with the earlier described embodiment is omitted.

As illustrated in FIG. 9, a memory system 1000' according to an embodiment of the present invention may include a memory device 1200' and the controller 1100. In addition, the controller 1100 may include the RAM 1110, the CPU 1120, the host interface 1130, the ECC circuit 1140 and the memory interface 1150.

The memory device 1200' may be a non-volatile memory device. The memory device 1200' may be the semiconductor memory device described above with reference to FIGS. 1A to 7. In addition, the memory device 1200' may include a plurality of first stacked structures, a plurality of second stacked structures and a plurality of lines. The first stacked structures may include first to n-th material layers that have a plurality of first contact regions defined at ends thereof (where n is a natural number equal to or greater than 2). The second stacked structures may include first to n-th material layers that have second contact regions defined at ends thereof and be disposed between the first stacked structures so that the first contact regions and the second contact regions may overlap each other. The lines may be coupled in common to the first contact regions and the second contact regions. Since the memory device 1200' is configured and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may be configured to communicate with the controller 1100 through first to kth channels CH1 to CHk. In addition, memory chips, included in a single group, may be configured to communicate with the controller 1100 through a common channel. The memory system 1000' may be modified so that a single memory chip may be coupled to a single channel.

As described above, since the memory system 1000' according to an embodiment of the present invention includes the memory device 1200' that has an improved degree of integration and an increased driving speed, data storage capacity and driving speed of the memory system 1000' may be increased. The data storage capacity and driving speed of the memory system 1000' may be further increased by forming the memory system 1200' using a multi-chip package.

Figure 10:
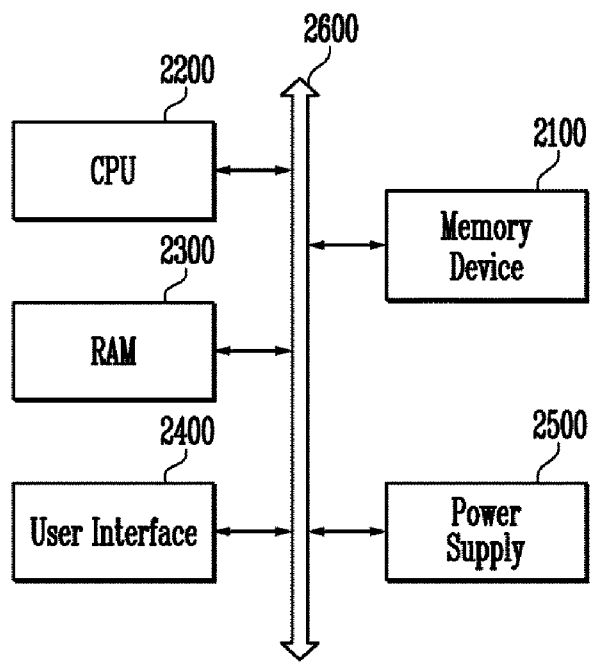
FIG. 10 is a block diagram of the configuration of a computing system according to an embodiment of the present invention.

FIG. 10 is a block diagram of the configuration of a computing system according to an example of an embodiment of the present invention. Hereinafter, a description of common contents with the earlier described embodiments is omitted.

As illustrated in FIG. 10, a computing system 2000 according to an embodiment of the present invention may include a memory device 2100, a CPU 2200, random-access memory (RAM) 2300, a user interface 2400, a power supply 2500 and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. Furthermore, the memory device 2100 may be the semiconductor memory device described above with reference to FIGS. 1A to 7. The memory device 2100 may include first to n-th material layers that have a plurality of first contact regions defined at ends thereof (where n is a natural number equal to or greater than 2). The second stacked structures may include first to n-th material layers that have second contact regions defined at ends thereof and be disposed between the first stacked structures so that the first contact regions and the second contact regions may overlap each other. Since the memory device 2100 is configured and manufactured in the above-described manner, a detailed description thereof will be omitted.

In addition, as described above with reference to FIG. 9, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, since the memory system 2000 according to an embodiment of the present invention includes the memory device 2100 that has an improved degree of integration and an increased driving speed, data storage capacity and speed of the memory system 1000 may be increased.

Figure 11:
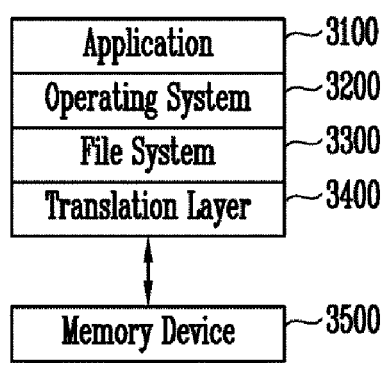
FIG. 11 is a block diagram of a computing system according to an embodiment of the present invention.

FIG. 11 is a block diagram of a computing system according to an embodiment of the present invention.

As illustrated in FIG. 11, a computing system 3000 according to an embodiment of the present invention may include a software layer that has an operating system 3200, an application 3100, a file system 3300 and a translation layer 3400. In addition, the computing system 3000 may include a hardware layer such as a memory device 3500.

The operating system 3200 is configured to manage software and hardware resources of the computing system 3000. The operating system 3200 may control program execution of a central processing unit. The application 3100 may include various application programs executed by the operating system 3200.

The file system 3300 may refer to a logical structure configured to manage data and files present in the computing system 3000. The file system 3300 may organize files or data to be stored in the memory device 3500 according to rules. The file system 3300 may be determined depending on the operating system 3200 which is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 11 illustrates the operating system 3200, the application 3100 and the file system 3300 in separate blocks. However, the application 3100 and the file system 3300 may be included in the operating system 3200.

The translation layer 3400 may translate an address so as to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a non-volatile memory. The memory device 3500 may be the semiconductor memory device described above with reference to FIGS. 1A to 7. In addition, the memory device 3500 may include first to n-th material layers that have a plurality of first contact regions defined at ends thereof (where n is a natural number equal to or greater than 2). The second stacked structures may include first to n-th material layers that have second contact regions defined at ends thereof and be disposed between the first stacked structures so that the first contact regions and the second contact regions may overlap each other. Since the memory device 3500 is configured and manufactured in the above-described manner, a detailed description thereof will be omitted.

The computing system 3000 having the above-described configuration may be divided into an operating system layer that is operated in an upper layer region and a controller layer that is operated in a lower level region. The application 3100, the operating system 3200 and the file system 3300 may be included in the operating system layer and driven as an operation memory. In addition, the translation layer 3400 may be included in the operating system layer or the controller layer.

As described above, since the computing system 3000 according to an embodiment of the present invention includes the memory device 3500 having an improved degree of integration and an increased driving speed, data storage capacity and driving speed of the computing system 3000 may be improved.

According to embodiments of the present invention, an area of a contact region of a semiconductor memory device may be reduced. In addition, stacked structure, lines and contact plugs may be efficiently arranged. Therefore, a degree of integration of the semiconductor device may be increased.

What is claimed is:

1. A semiconductor memory device, comprising:
    a plurality of first stacked structures including a plurality of first material layers at ends of which first contact regions are defined;
    a plurality of second stacked structures including a plurality of second material layers, wherein second contact regions are defined at ends of the second material layers and arranged between the first stacked structures so that the first contact regions and the second contact regions overlap each other; and
    a plurality of lines coupled in common to the first contact regions and the second contact regions,
    wherein the first contact regions of the first material layers are coupled in sequential order to the lines, and the second contact regions of the second material layers are coupled in reverse order to the lines.

2. The semiconductor memory device of claim 1, wherein ends of the first and second stacked structures are stepped, and the first or second contact regions are defined at respective layers thereof.

3. The semiconductor memory device of claim 1, further comprising:
    a plurality of lines coupled in common to the first contact regions and the second contact regions, wherein the first and second stacked structures extend in a first direction, and the lines extend in a second direction crossing the first direction.

4. The semiconductor memory device of claim 1, further comprising:
    a plurality of lines coupled in common to the first contact regions and the second contact regions, wherein the first material layers and the second material layers are channel layers, and the lines are drain selection lines.

5. The semiconductor memory device of claim 4, further comprising:
    first word lines contacting the first stacked structures and extending in a direction crossing the first stacked structures; and
    second word lines contacting the second stacked structures and extending in a direction crossing the second stacked structures.

6. The semiconductor memory device of claim 4, further comprising:
    first source lines contacting the first stacked structures and extending in a direction crossing the first stacked structures; and
    second source lines contacting the second stacked structures and extending in a direction crossing the second stacked structures.

7. The semiconductor memory device of claim 4, further comprising:
    a plurality of first bit lines extending in substantially the same direction as the first stacked structures and coupled to the first contact regions of the first stacked structures; and
    a plurality of second bit lines extending in substantially the same direction as the second stacked structures and coupled to the second contact regions of the second stacked structures.

8. The semiconductor memory device of claim 1, further comprising:
    a plurality of lines coupled in common to the first contact regions and the second contact regions, wherein the first material layers and the second material layers are word lines, and the lines are local voltage supply lines configured as word lines.

9. The semiconductor memory device of claim 8, further comprising:
first channel layers passing through a cell region of the first stacked structures; and
second channel layers passing through a cell region of the second stacked structures.

10. The semiconductor memory device of claim 9, further comprising:
first bit lines formed over the first stacked structures and coupled to the first channel layers; and
second bit lines formed over the second stacked structures and coupled to the second channel layers.

11. The semiconductor memory device of claim 8, further comprising:
first source regions formed under the first stacked structures;
second source regions formed under the second stacked structures;
a plurality of first local contact plugs configured as sources located between the first stacked structures and the second stacked structures, wherein the plurality of first local contact plugs are coupled to the first source regions; and
a plurality of second local contact plugs configured as sources located between the first stacked structures and the second stacked structures, wherein the plurality of second local contact plugs are coupled to the second source regions.

12. The semiconductor memory device of claim 11, further comprising:
a first local voltage supply line configured as a source extending in a direction crossing the first stacked structures, wherein the first local voltage supply line is coupled to the first local contact plugs configured as the sources; and
a second local voltage supply line configured as a source extending in a direction crossing the second stacked structure, wherein the second local voltage line is coupled to the second local contact plugs configured as the sources.

13. The semiconductor memory device of claim 12, further comprising:
global voltage supply lines configured as word lines extending in substantially the same direction as the first and second stacked structures, wherein the global voltage supply lines are coupled to the local voltage lines configured as the word lines, respectively;
a first global voltage supply line configured as a source extending in substantially the same direction as the first stacked structures, wherein the first global voltage supply line is coupled to the first local voltage supply line configured as the source; and
a second global voltage supply line configured as a source extending in substantially the same direction as the second stacked structures, wherein the second global voltage supply line is coupled to the second local voltage supply line configured as the source.

14. A semiconductor memory device, comprising:
a plurality of first strings stacked sequentially;
a plurality of second strings stacked sequentially; and
a plurality of drain selection lines coupled in common to a first string, among the plurality of first strings, and a second string, among the plurality of second strings, wherein the plurality of drain selection lines are coupled in sequential order to the plurality of first strings and in reverse order to the plurality of second strings.

15. The semiconductor memory device of claim 14, further comprising:
a plurality of first word lines coupled to first memory cells included in the plurality of first strings; and
a plurality of second word lines coupled to second memory cells included in the plurality of second strings.

16. The semiconductor memory device of claim 15, wherein in strings coupled to a same drain selection line, among the plurality of drain selection lines, the first memory cells coupled to a kth first word line of the plurality of first word lines and the second memory cells coupled to a kth word line of the plurality of second word lines are driven as a single page, where k is a natural number satisfying $1 \leq k \leq m$.

17. A semiconductor memory device, comprising:
a plurality of first strings including a plurality of first memory cells stacked sequentially;
a plurality of second strings including a plurality of second memory cells stacked sequentially;
a plurality of first word lines coupled to the plurality of first memory cells included in the plurality of first strings;
a plurality of second word lines coupled to the plurality of second memory cells included in the plurality of second strings; and
a plurality of local voltage supply lines coupled in common to a first word line, among the plurality of first word lines, and a second word line, among the plurality of second word lines, wherein the plurality of local voltage supply lines are coupled in sequential order to the plurality of first word lines and in reverse order to the plurality of second word lines.

18. The semiconductor memory device of claim 17, further comprising a plurality of global voltage supply lines coupled to the plurality of local voltage supply lines, respectively.

19. The semiconductor memory device of claim 17, wherein memory cells coupled to the same local voltage supply line, among the plurality of local voltage supply lines, are driven as a single page.

20. A semiconductor memory device, comprising:
a plurality of first stacked structures including a plurality of first material layers at ends of which first contact regions are defined; and
a plurality of second stacked structures arranged between the first stacked structures and including a plurality of second material layers, wherein second contact regions are defined at ends of the second material layers and the first contact regions and the second contact regions overlap each other,
wherein first cell regions are defined at the first material layers and second cell regions are defined at the second material layers so that the first contact regions and the second contact regions are placed between the first cell regions and the second cell regions.

* * * * *